(12) United States Patent
Sheth

(10) Patent No.: US 11,340,103 B2
(45) Date of Patent: May 24, 2022

(54) METHOD OF CALCULATING VISCOUS PERFORMANCE OF A PUMP FROM ITS WATER PERFORMANCE CHARACTERISTICS AND NEW DIMENSIONLESS PARAMETER FOR CONTROLLING AND MONITORING VISCOSITY, FLOW AND PRESSURE

(71) Applicant: Halliburton Energy Services, Inc., Houston, TX (US)

(72) Inventor: Ketankumar Kantilal Sheth, Tulsa, OK (US)

(73) Assignee: Halliburton Energy Services, Inc., Houston, TX (US)

( * ) Notice: Subject to any disclaimer, the term of this patent is extended or adjusted under 35 U.S.C. 154(b) by 303 days.

(21) Appl. No.: 16/582,684

(22) Filed: Sep. 25, 2019

(65) Prior Publication Data
US 2021/0088368 A1    Mar. 25, 2021

(51) Int. Cl.
*G01F 15/00* (2006.01)
*G06F 30/20* (2020.01)

(52) U.S. Cl.
CPC .............. *G01F 15/00* (2013.01); *G06F 30/20* (2020.01)

(58) Field of Classification Search
CPC ........ G01F 15/00; G01F 1/74; G01F 25/0007; G06F 30/20; G06F 17/5009; F04D 29/2222; F04D 31/00; F04D 13/10; F04B 49/065
USPC ....................................................... 702/182
See application file for complete search history.

(56) References Cited

U.S. PATENT DOCUMENTS

| 6,041,856 A | 3/2000 | Thrasher et al. |
| 7,094,016 B1 * | 8/2006 | Zaher ...................... F04D 31/00 415/1 |
| 7,861,777 B2 | 1/2011 | Sheth et al. |
| 8,417,483 B2 | 4/2013 | Anderson et al. |

(Continued)

FOREIGN PATENT DOCUMENTS

WO    2015053784 A1    4/2015

OTHER PUBLICATIONS

Barrios, L., "ESP Technology Maturation: Subsea Boosting System with High GOR and Viscous Fluids," SPE 159186, Society of Petroleum Engineers, 22 pages, SPE Annual Technical Conference and Exhibition held in San Antonio, Texas, Oct. 8-10, 2012.

(Continued)

*Primary Examiner* — John H Le
(74) *Attorney, Agent, or Firm* — John Wustenberg; Parker Justiss, P.C.

(57) ABSTRACT

Introduced herein are a dimensionless relationship between a volumetric flow rate, a head and a kinematic viscosity in a pump operation and a method that uses the dimensionless relationship to predict a viscous performance of a pump from water performance characteristics. Using the introduced dimensionless relationship, which is called Ketan's viscous head number, the introduced method determines a viscous head correlation that allows the prediction of the pump performance to be made accurately at any given speed, flow rate and viscosity. The introduced Ketan's viscous head number and method thus allow a prediction of a pump performance in a viscous application to be made from water performance characteristics without physically testing the pump in the viscous application.

20 Claims, 5 Drawing Sheets

(56) References Cited

U.S. PATENT DOCUMENTS

| | | |
|---|---|---|
| 9,587,640 B2 | 3/2017 | Ahonen et al. |
| 2013/0317762 A1 | 11/2013 | Camilleri |

OTHER PUBLICATIONS

Gulich, J. F., "Centrifugal Pumps" Chapter 13—Influence of the medium on performance, 2nd Edition book, 2010, 14 pages, Springer Heidelberg Dordrecht London New York.

Morrison, G. L., et al., "Pump Affinity Laws Modified to Include Viscosity and Gas Effects," Turbomachinery Laboratory, 2017, Texas A&M Engineering Experiment Station, 16 pages.

Patil, A., et al., "Further Evaluation of the Modified Affinity Laws for the Prediction of Viscosity Effect on the Pump Head Performance," Turbomachinery Laboratory, 2018, Texas A&M Engineering Experiment Station, 14 pages.

Patil, A., et al., "Centifugal Pump Head Prediction Using Affinity Laws Modified for Viscosity," SPE-190926-MS, Society of Petroleum Engineers, SPE Artificial Lift Conference and Exhibition, Aug. 28-30, 2018, 10 pages.

Brazil, H. O-S., et al., "Successful Production Allocation Through ESP Performance in Peregrino Field," SPE 152391, Society of Petroleum Engineers, SPE Latin American and Caribbean Petroleum Engineering Conference, Apr. 16-18, 2012, 15 pages.

Ippen, A. T., "The Influence of viscosity on cenliifugal pump performance," Trans. ASME, vol. 68, 1946, Civil and Environmental Engineering, Lehigh University, 17 pages.

Sheth, K., et al., "Viscosity Correction Factors," ESP Workshop, 2009 Society of Petroleum Engineers, Gulf Coast Section Electric Submersible Pump Workshop, Apr. 29 to May 1, 2009, 11 pages.

Wilson, B. L., et al., "Viscous and Gas Effects on the Peformance of Multistage Centrifugal Pumps," ESP Workshop, 2011 Society of Petroleum Engineers, Gulf Coast Section Electric Submersible Pump Workshop, Apr. 25-29, 2011, 9 pages.

* cited by examiner

METHOD OF CALCULATING VISCOUS PERFORMANCE OF A PUMP FROM ITS WATER PERFORMANCE CHARACTERISTICS AND NEW DIMENSIONLESS PARAMETER FOR CONTROLLING AND MONITORING VISCOSITY, FLOW AND PRESSURE

TECHNICAL FIELD

This application is directed, in general, to a method and a system for estimating a performance of a pump and, more specifically, to a method and a system for estimating a performance of a pump in a viscous application from its water performance characteristics.

BACKGROUND

Centrifugal pumps have been developed and used for centuries in handling viscous fluids. Performance of a centrifugal pump is affected by many factors such as viscosity, speed, stage diameter, flow rate, and hydraulic design of the pump. Generally, a pump is tested in water at atmospheric conditions and its performance at a fixed speed is used for the selection of the pump and a number of stages. Predicting a performance of a pump in a viscous application is very difficult as the performance is dependent upon the speed of the pump, viscosity and flow rate. For a given viscous application, a pump is generally tested in various viscosity fluids at a range of speeds and its test data is interpolated. This testing has been found to be a lengthy and costly process. Additionally, interpolating and modelling of a performance for using in an application is complex and introduces inaccuracies in the prediction of the performance.

SUMMARY

One aspect of the disclosure provides a method for predicting a performance of a pump in fluid of interest at a desired RPM. One embodiment of the method includes: receiving water performance characteristics of the pump at a fixed RPM; determining Ketan's viscous head numbers for flow rates of the pump in water at a desired RPM using the water performance characteristics of the pump at the fixed RPM, the Ketan's viscous head numbers representing ratios of the flow rates to corresponding heads at a fixed internal resistance and at the desired RPM; determining a viscous head correlation between normalized flow rates of the pump in water at the desired RPM and normalized Ketan's viscous head numbers corresponding to the normalized flow rates using water performance characteristics of the pump at the desired RPM; and predicting the performance of the pump in the fluid of interest at the desired RPM using the viscous head correlation.

Another aspect of the disclosure provides a system for predicting a performance of a pump in fluid of interest at a desired RPM. One embodiment of the system includes: an interface configured to receive water performance characteristics of the pump at a fixed RPM; and a processor coupled to the interface and configured to: determine Ketan's viscous head numbers for flow rates of the pump in water at a desired RPM using water performance characteristics of the pump at a fixed RPM, wherein the Ketan's viscous head numbers represent ratios of the flow rates to corresponding heads at a fixed internal resistance and at the desired RPM; determine a viscous head correlation between normalized flow rates of the pump in water at the desired RPM and normalized Ketan's viscous head numbers corresponding to the normalized flow rates using water performance characteristics of the pump at the desired RPM; and predict the performance of the pump in the fluid of interest at the desired RPM using the viscous head correlation.

Yet another aspect of the disclosure includes a method of modelling performance characteristics of a pump in a viscous application. One embodiment of the method includes: forming a dimensionless number using operational parameters of the pump; and using the dimensionless number in a ratio term to model the performance characteristics of the pump for various operating conditions.

BRIEF DESCRIPTION OF THE DRAWINGS

Reference is now made to the following descriptions taken in conjunction with the accompanying drawings, in which.

DETAILED DESCRIPTION

Figure 1:
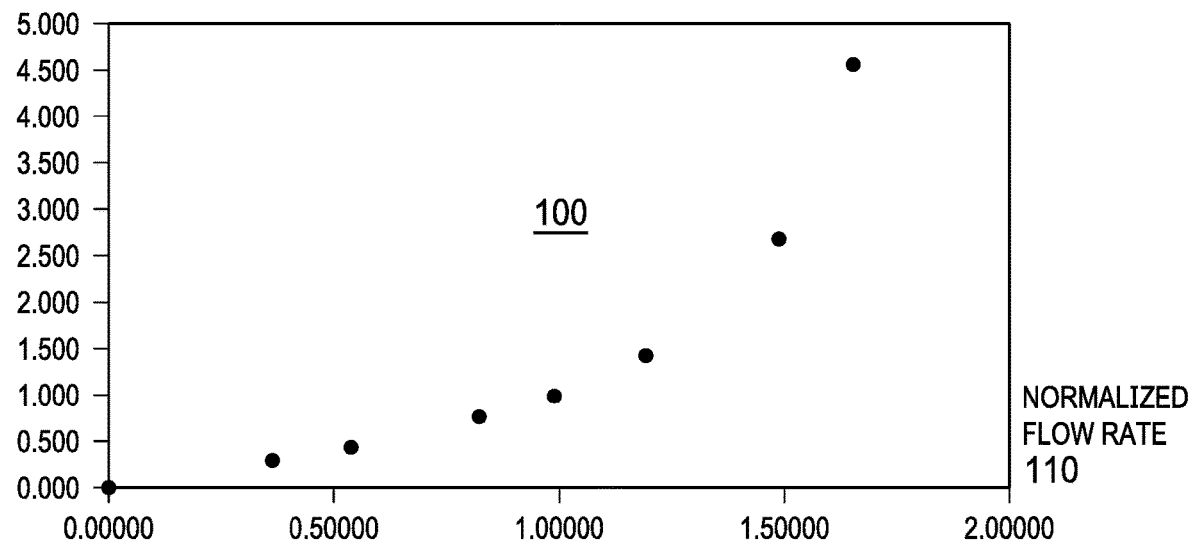
FIG. 1 is a graph of a relationship between normalized flow rates and normalized Ketan's viscous head numbers for a pump in water at a given RPM.

Electrical Submersible Pumps have been used to pump oil out of subterranean formation since 1930's. An ESP is a multi-stage centrifugal pump having a few to hundreds of stages that runs at variable speeds, e. g., from 1500 Revolutions per minute (RPM) to 8000 RPM, and can pump out from few hundreds to few hundreds of thousands of barrels per day (BPD). Selection of a pump sizing for a given viscous application includes a selection of a stage type, a number of pump stages, (optional gas separator), seal (protector) and motor.

Performance prediction of an ESP in viscous applications, especially in an offshore application, is particularly important and requires higher accuracy than the accuracy provided by conventional prediction tools. This is due to the fact that the cost of running an offshore application is very expensive and a small discrepancy in the sizing and prediction of proper pump type can result in a loss of several millions of dollars.

For determining a proper sizing of a pump stage for a viscous application, its performance in various viscosities needs to be known. Generally, a pump having few stages is built and tested in desired ranges of viscosities and speeds in a test facility before the pump is sized and deployed in the actual application. The test results are used for a prediction of the pump performance in the actual application, such as an offshore production application, and the prediction is used in properly selection of sizing of the pump and its motor before deployment. This building-testing-analyzing-modelling-predicting process is not only very costly and time-consuming but is also inaccurate as viscosities and speeds can vary widely based on the actual application.

Introduced herein is a dimensionless relationship between a volumetric flow rate, a head and a kinematic viscosity that simplifies the prediction of viscous pump performance. The introduced relationship is referred through the disclosure as a Ketan's viscous head number and is expressed as Equation (1):

$$\text{Ketan's viscous head number} = q/h^*v \quad \text{Equation (1),}$$

where q is a volumetric flow rate, h is a head and v is a kinematic viscosity.

Head is a function of flow rate, speed, stage diameter, and hydraulic design of the pump; flow rate is affected by speed, stage diameter, and hydraulic design of the pump; and kinematic viscosity is a fixed fluid property.

Ketan's viscous head number can also be represented in different ways as represented by Equations (2) and (3) below:

$$(q^*\rho)/(p^*v) = \text{mass flow rate/(pressure*kinematic viscosity)} \quad \text{Equation (2),}$$

$$(q^*\rho)/(h^*\mu) = \text{mass flow rate/(head*absolute viscosity)} \quad \text{Equation (3),}$$

where $\rho$ is a density, p is a pressure and $\mu$ is an absolute viscosity.

Ketan's viscous head number represents a measure of a pump performance condition: a ratio of flow rate to the resultant head at a given viscosity. In other words, it is a ratio of volumetric or mass flow rate to the head or pressure at a fixed internal resistance or viscosity.

Ketan's viscous head number can be calculated using published water performance characteristics of a given pump at a fixed speed (RPM) using Equation (1). Water performance characteristics of a given pump is generally available from the pump's manufacturer and are provided in the form of a pump curve, which is drawn with respect to flow rate, head and brake horse power (BHP) at a fixed speed, e.g., an RPM. Generally, water pump performance characteristics of an ESP pump are published at 50 Hz (2917 RPM) and/or 60 Hz (3500 RPM) depending on the primary usage of the pump.

Illustrated in FIG. 1 is a relationship 100 between normalized flow rates 110 and normalized Ketan's viscous head numbers 120 for a pump in water at a given RPM. The relationship 100 varies with a change in a pump design and is also a function of a pump specific speed. The relationship 100 may be used for a prediction of a viscous performance of the pump at a different RPM and in different fluid. The relationship 100 is referred hereafter as Ketan's viscous head number correlation.

The normalized flow rates 110 on the x axis are determined using the water performance characteristics of the pump. Flow rates from the water performance characteristics are normalized using a flow rate at a reference point, e.g., best efficiency point (BEP), for the given RPM. BEP refers to a point in a pump curve where the efficiency is the highest. For the normalization, each of the flow rates may be divided by the BEP flow rate.

The normalized Ketan's viscous head numbers 120 on the y axis are determined using the water performance characteristics of the pump. Using Equation (1) and the flow rates, viscosity and heads from the water performance characteristics, Ketan's viscous head numbers are first calculated. As the flow rates and heads are from the water performance characteristics performance, the viscosity is 1 centipoise. The calculated Ketan's viscous head numbers are then normalized using a Ketan's viscous head number at the reference point, e.g., BEP. Similar to the normalized flow rates 110, each of the Ketan's viscous head numbers 120 is divided by the Ketan's viscous head number at the BEP for the normalization.

Figure 2:
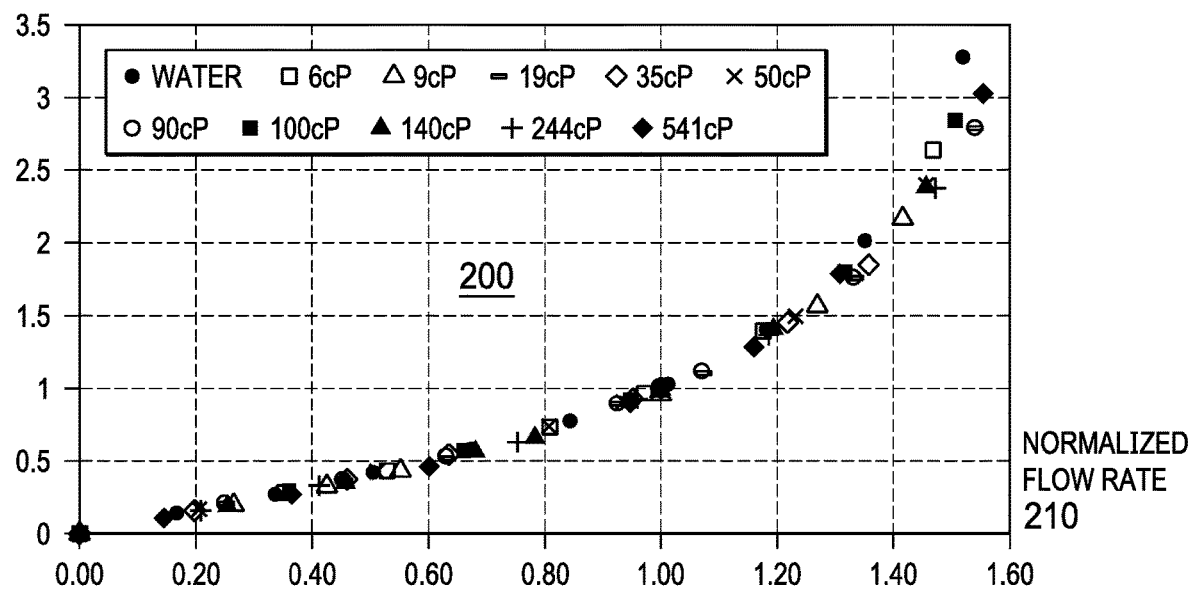
FIG. 2 is graphs of relationships between normalized flow rates and normalized Ketan's viscous head numbers for a pump in various viscous fluids at a given RPM.

FIG. 2 illustrates relationships 200 between various normalized flow rates 210 and normalized Ketan's viscous head numbers 220 for the same pump at the same RPM but at different viscosities in FIG. 1. Unlike the relationship 100 in FIG. 1, the relationships 200 are for fluids other than water. The fluids include first fluid having 6 centipoise viscosity (hollow square), second fluid having 9 centipoise viscosity (hollow triangle), third fluid having 19 centipoise (solid rectangle), fourth fluid having a 35 centipoise (hollow diamond), fifth fluid having a 50 centipoise (X), sixth fluid having 90 centipoise (hollow circle), seventh fluid having a 100 centipoise (solid square), eighth fluid having 140 centipoise (solid triangle), ninth fluid having 244 centipoise (+), and tenth fluid having 541 centipoise ( ▨ ).

As shown, while the fluids and their viscosities differ, their viscous head number correlation, i.e., the relationship between their normalized flow rates to their normalized Ketan's viscous head numbers, remains same. As such, a Ketan's viscous head number correlation of a pump in water at a given RPM, e.g., 100 and 200 in FIGS. 1 and 2, can be used in predicting a performance of the pump in a viscous application.

Figure 3:
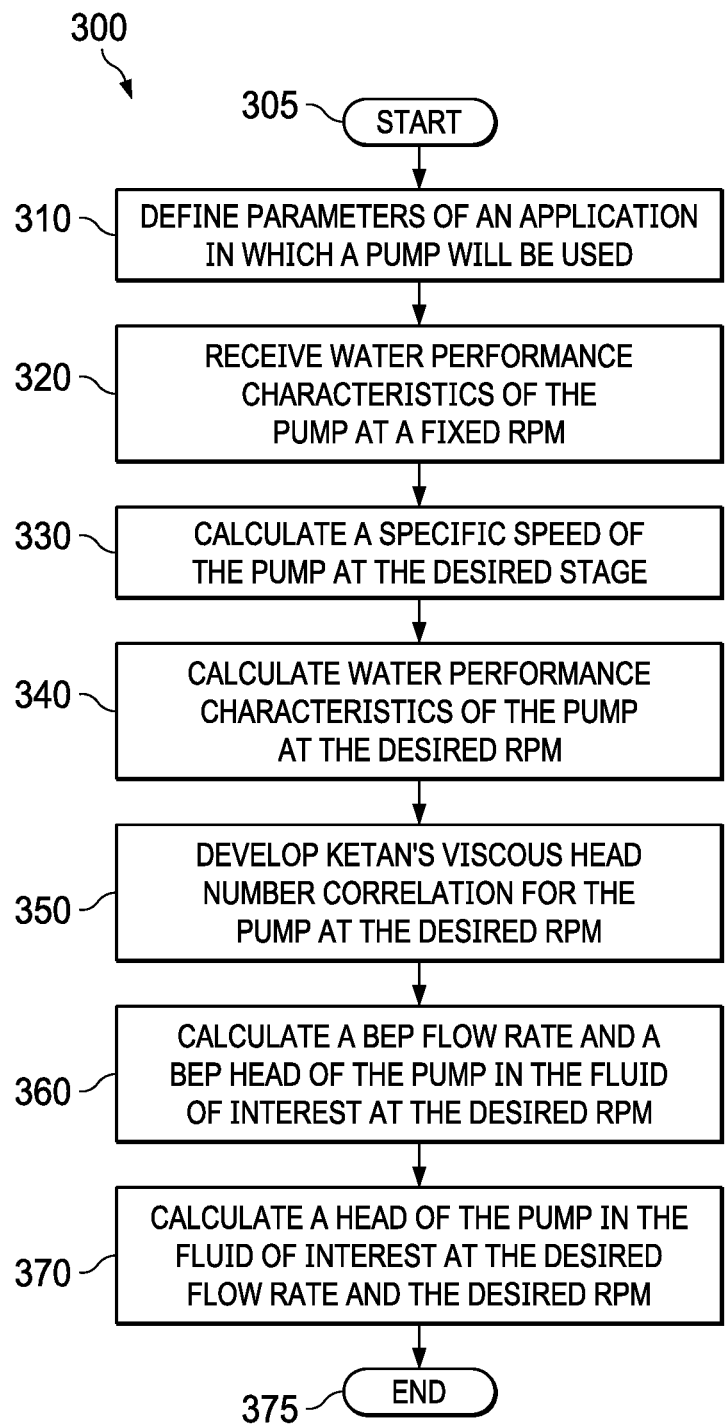
FIG. 3 is a flow diagram of an embodiment of a method for predicting a performance of a given pump in a fluid of interest having desired viscosity at a desired RPM.

FIG. 3 illustrates a flow diagram of an embodiment of a method 300 for predicting a performance of a pump in a fluid of interest at a desired RPM. The method 300, or at least a portion thereof, may be performed by a computer system, such as 500 in FIG. 5. A series of instructions that causes, when executed, a processor of a computer system to perform the method 300 may be stored in a computer readable medium, such as a CD-ROM, a floppy disk, a flash drive, or another type of data storage. The method 300 starts at step 305.

At step 310, parameters of an application in which the pump will operate are defined. The parameters may include: fluid of interest (desired viscosity) in which the pump will operate, a desired flow rate (the flow rate at which the operator wants to move the fluid of interest), and a desired speed (the RPM at which the operator wants to operate the motor of the pump), and a desired pump (the pump can be of different diameter and different number of stages based on the application—the stage in which the operator wants to operate the pump).

At step 320, water performance characteristics of the pump at a fixed RPM are received. The fixed RPM may be one of the RPMs, such as 3500 RPM, 2917 RPM and/or 1750 RPM, at which water performance characteristics of a pump are published and provided by the manufacturer of the pump. Water performance characteristics may be in the form of a performance curve drawn with respect flow rate, head and BHP at a certain RPM. BEP water performance characteristics of the pump may be indicated in the performance curve, and if not indicated, BEP water performance characteristics may be interpolated from the curve. It should be understood throughout the disclosure that water is assumed to have a viscosity of 1 centipoise and room temperature of 20°.

At step 330, a specific speed of the pump, i.e., the desired pump, is calculated. The specific speed of the pump is calculated using the BEP water performance characteristics of the pump at the fixed RPM, which are received at step 320. A specific speed is a number characterizing the type of impeller in a pump in a unique and coherent manner. A specific speed is determined independent of the pump size and can be useful when comparing different pump designs. Specific speed is calculated using Equation (4):

$$Ns=(n*q^{0.5})/(h^{0.75})$$   Equation (4), where Ns=specific speed, n=pump shaft rotational speed (rpm), q=flow rate (m3/h, 1/s, 1/min, m3/min, US gpm, British gpm) at Best Efficiency Point (BEP), h=head rise (m, ft).

From the specific speed, a flow type of the pump may be estimated. The specific speed for a radial flow ranges from about 500 to about 1500-1700, the specific speed for a mixed flow ranges from about 1500-1700 to about 7000-8000, and the specific speed for an axial flow ranges from about 7000-8000 to about 20000.

At step 340, water performance characteristics of the pump at the desired RPM are calculated. If the desired RPM is different than the RPM of the published performance curve, then affinity laws are used. In the illustrated embodiment, the water performance characteristics of the pump at the desired RPM include BEP water performance characteristics of the pump at the desired RPM. The calculation uses affinity laws and the water performance characteristics of the pump at the fixed RPM. The affinity laws provide that:

flow rate at the desired RPM=flow rate at the fixed RPM*(the desired RPM/the fixed RPM);

head at the desired RPM=head at the fixed RPM* (the desired RPM/the fixed RPM)^2; and BHP at the desired RPM=BHP at the fixed RPM* (the desired RPM/the fixed RPM)^3.

Affinity laws are used for a calculation of water performance from one speed to another. It is also used for design of a new pump from the existing pump. It is understood that the affinity laws described above are not applicable in viscous applications, e.g., for fluid other than water, because the viscosity affects the various losses, such as leakage and friction losses, that are not proportionate to the speed.

Using the example values provided above, the BEP flow rate for the pump example at 2333 RPM would be 1974 BPD, the BEP head at 2333 RPM would be 24.88 ft., and the BEP BHP at 2333 RPM would be 0.531 HP.

At step 350, Ketan's viscous head number correlation for the pump in water at the desired RPM is developed. In the illustrated embodiment, Ketan's viscous head number correlation for the pump in water at the desired RPM is developed based on the water performance characteristics of the pump at the desired RPM. As described above with respect to FIGS. 1 and 2, normalized flow rates and normalized Ketan viscous head numbers are first determined before developing the Ketan's viscous head number correlation.

Normalized flow rates for the pump at the desired RPM are determined by normalizing various flow rates of the pump in the water at the desired RPM using a reference flow rate at the desired RPM. In the illustrated embodiment, the reference flow rate is the BEP flow rate at the desired RPM, and the normalized flow rates are determined by dividing the various flow rates of the pump at the desired RPM with the BEP flow rate. It is understood that flow rates other than the BEP flow rate, such as a near zero flow rate or near maximum flow rate, can also be used for the normalization of the flow rates.

Normalized Ketan's viscous head numbers for the pump at the desired RPM are determined by normalizing Ketan's viscous head numbers of the pump in the water at the desired RPM using a Ketan's viscous head number for the reference flow rate of the pump in the water at the desired RPM. As discussed above, a Ketan's viscous head number is a ratio of a flow rate to a corresponding head at a fixed viscosity. As such, considering that viscosity of water is 1, each Ketan's viscous head number is calculated by dividing each flow rate with a corresponding head.

Once the Ketan's viscous head numbers at various flow rates are calculated, they are normalized by being divided with a reference Ketan's viscous head number. In the illustrated embodiment, the reference Ketan's viscous head number is a Ketan's viscous head number for the reference flow rate, which is the BEP flow rate. Although not explicitly shown, if the normalized flow rates and Ketan's viscous head numbers of the pump are mapped, they would form a curve similar to the relationships 100, 200 in FIGS. 1 and 2.

At step 360, a BEP flow rate and a BEP head of the pump in the fluid of interest at the desired RPM are calculated. In the illustrated embodiment, the BEP flow rate and BEP head of the pump in the fluid of interest at the desired RPM are calculated based on flow rate and head correction factors with respect to viscosity and RPM relationship and the BEP water performance characteristics of the pump at the desired RPM.

The flow rate correction factor for the BEP flow rate of the pump in the fluid of interest at the desired RPM is derived from a correlation of BEP flow rate ratio, which is a ratio of a BEP flowrate at the desired viscosity and at a given RPM to a BEP flow rate of water at the given RPM, with changing RPM and viscosity. Similarly, the head correction factor for the BEP flow rate of the pump in the fluid of interest at the desired RPM is derived from a relationship of BEP head ratio, i.e., a ratio of a BEP head at the desired viscosity and at the given RPM to a BEP head of water at the given RPM, with changing RPM and viscosity. Once the correction factors are derived, the BEP flow rate and BEP head of the pump in the fluid of interest at the desired RPM are calculated by multiplying the BEP flow rate and BEP head correctional factors to the water BEP flow rate and water BEP head at the desired RPM, respectively.

At step 370, the performance of the pump in a desired application is predicted. The desired application is represented by the parameters that have been defined in step 310. In the illustrated embodiment, using the desired flow rate defined in the step 310, the head of the pump in the fluid of interest at the desired flow rate and the desired RPM is determined.

As a first step, a normalized desired flow rate of the pump in the fluid of interest at the desired RPM is calculated based on the BEP flow rate of the pump in the fluid of interest at the desired RPM from step 360 and the desired flow rate from step 310. More specifically, the normalized desired flow rate of the pump in the fluid of interest at the desired RPM is calculated by dividing the desired flow rate with the BEP flow rate of the pump in the fluid of interest at the desired RPM.

Once the normalized desired flow rate of the pump in the fluid of interest at the desired RPM is calculated, a normalized Ketan's viscous head number corresponding to the normalized BEP flow rate of the pump is calculated using the Ketan's viscous head number correlation from step 350. From the Ketan's viscous head number correlation, the normalized Ketan's viscous head number (Ketan Viscous head factor) may be interpolated.

The head of the pump in the fluid of interest at the desired flow rate and the desired RPM is calculated based on the desired flow rate of the pump in the fluid of interest at the desired RPM, the BEP flow rate and BEP head of the pump in the fluid of interest at the desired RPM, and the normalized Ketan's viscous head number. The head of the pump may be calculated using Equation (5):

$$h_{cP1, speed1} = \frac{Q_{cP1, speed1} * h_{cP1, speed1, BEP}}{Q_{cP1, speed1, BEP} * \text{Ketan Viscous head factor}}, \quad \text{Equation (5)}$$

where $Q_{cp1, speed\ 1}$ is desired flow rate at desired speed and desired viscosity; $Q_{cp1, speed\ 1, BEP}$ is BEP flow rate at desired speed and desired viscosity; $h_{cp1, speed\ 1}$ is desired head at desired speed and desired viscosity; $h_{cp1, speed\ 1, BEP}$ is BEP head at desired speed and desired viscosity. The method 300 ends at step 375.

It is understood that the method 300 may be applicable to not only to a centrifugal pump but also to other types of a pump, such as a positive displacement pump, a rotary pump and a metering pump, that may be used in handling viscous fluid. It is also understood that in addition to the well production, the method 300 may also be used in other oil field applications, such as in mud pump performance control and monitoring, and chemical injection application in the oil well, e.g., for viscosity, scale inhibition, sand control, and in some instances, it may be used in non-field applications, such as in medical fields for blood flow control and monitoring, e.g., a measure of medicine transfer rate, and in chemical and petrochemical industry for control and monitoring injection and mixing of chemicals for proper chemical reactions.

To illustrate how the method 300 works in an actual application, the method 300 has been carried out with actual numbers of one ESP pump example. In the example, the operator may want to find out a head of a SJ2800 pump when it is moving fluid of 300 cP at 700 BPD and at 2333 RPM. These desired parameters are defined in the step 310.

Figure 4:
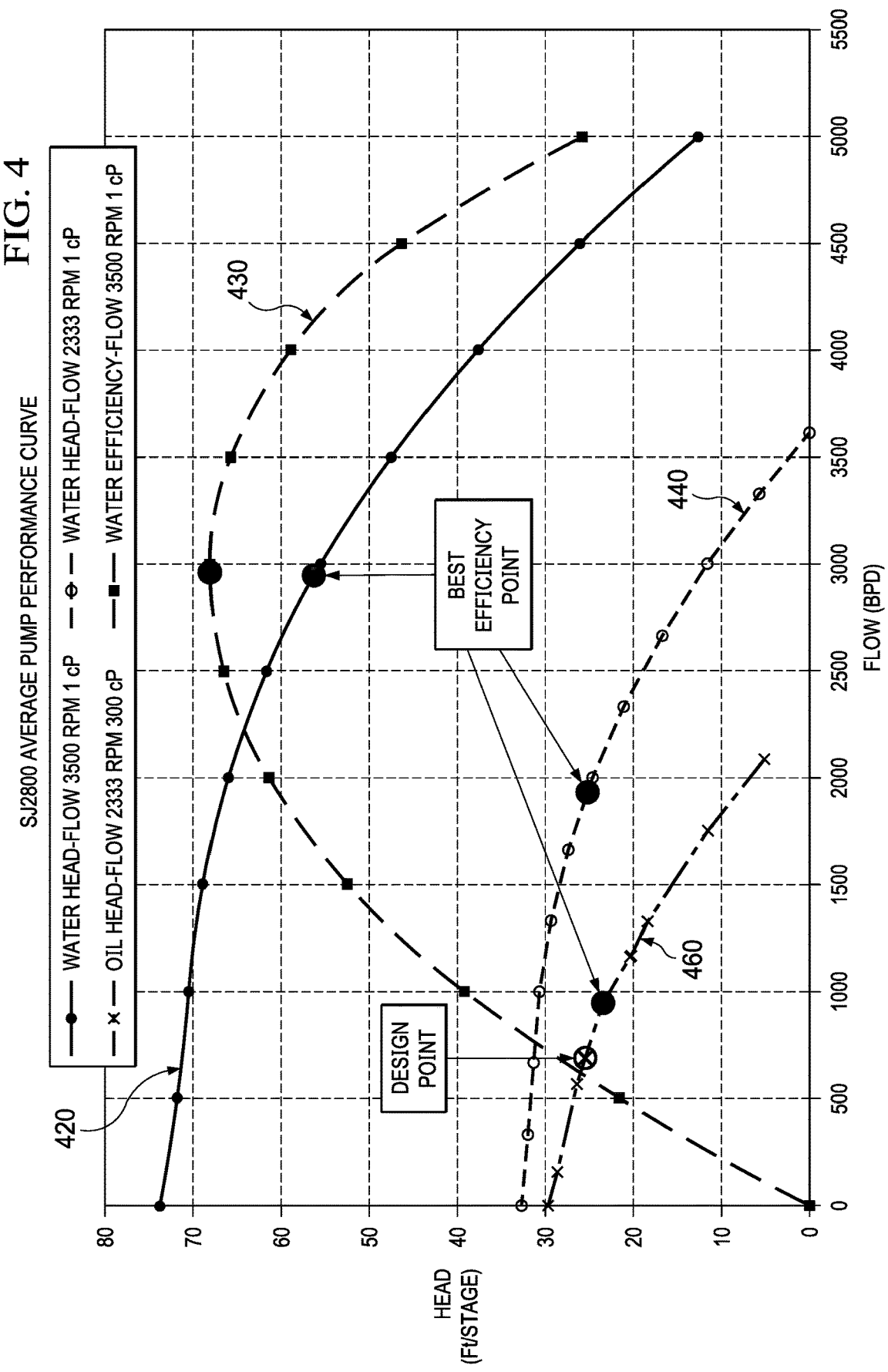
FIG. 4 is an illustration of performance curves of an exemplary pump.

Water performance characteristics of the SJ2800 pump at 3500 RPM or 60 Hz are received in the step 320. The received characteristics are illustrated as a performance curve 420 and an efficiency curve 430 in FIG. 4. The received characteristics are for a SJ2800 pump in water at room temperature and at atmospheric pressure with specific gravity of 1.00. The performance curve 420 shows variations of head in ft. with respect to change in flow rates in BPD at 3500 RPM. The efficiency curve indicates the water BEP characteristics at 3500 RPM, such as the BEP flow rate of 2961 BPD and the BEP head of 56 ft.

In the step 330, the specific speed of the pump example is calculated using the BEP flow rate and the BEP head. When calculated with the proper unit conversion, the specific speed of the pump is 1589 BPD. As the specific speed is between 500 and 1500-1700, the pump would likely have a radial flow type.

In the step 340, water performance characteristics of the pump example at 2333 RPM are calculated. The calculated flow rates are illustrated as a curve 440 in FIG. 4. At the 2333 RPM, the BEP flow rate for the pump example is 1974 BPD and the BEP head is 24.88 ft. Using the water performance characteristics of the pump example at 2333 RPM, Ketan's viscous head number correlation for the pump example in water at the desired RPM is developed in the step 350.

In the step 360, the BEP flow rate and the BEP head of the pump example in the fluid of interest (300 cP) at 2333 RPM are calculated. To do so, the correction factors for the BEP flow rate and BEP head are first derived. They are derived from relationships of BEP flow rate and BEP head ratios with changing RPM and viscosity, and in the example, they are 0.4678 and 0.9244, respectively. Using these correction factors, the BEP flow rate of the pump example in the fluid of interest at the 2333 RPM is 923.232 (1974*0.4678) BPD and the BEP head of the pump example is 23 (24.88*0.9244) ft. The BEP flow rate is a product of the water BEP flow rate at 2333 RPM and the correction factor for the BEP flow rate, and the BEP head is a product of the water BEP head at 2333 RPM and the correction factor for the BEP head.

In the step 370, the performance of the pump example in the application defined in the step 310, i.e. the head of the SJ2800 pump moving the fluid of interest at 700 BPD and at 2333 RPM, is determined. As described above with the step 370, the head of the SJ2800 pump in the viscous application is determined using the desired flow rate, the BEP flow rate and the BEP head of the SJ2800 pump in the fluid of interest at 2333 RPM, and a normalized BEP flow rate of the pump in the fluid of interest at 2333 RPM.

The normalized BEP flow rate of the SJ2800 pump in the fluid of interest at 2333 RPM is calculated by dividing the desired flow rate, i.e., 700 BPD from the step 310, with the BEP flow rate of the pump in the fluid of interest at 2333 RPM, i.e., 923.232, and is thus 0.758. Using the normalized BEP flow rate of the pump in the fluid of interest at 2333 RPM and the Ketan's viscous head number correlation from the step 350, a normalized Ketan's viscous head number (Ketan Viscous head factor) corresponding to the normalized BEP flow rate of the pump in the fluid of interest at 2333 RPM is calculated. The normalized Ketan's viscous head number is 0.708.

Plugging the BEP flow rate and BEP head of the SJ2800 pump in the fluid of interest at 2333 RPM, the desired flow rate, and the normalized Ketan's viscous head number into the Equation (5), the head of the pump example in the fluid of interest at 700 BPD and 2333 RPM is calculated. The head of the SJ2800 pump in the fluid of interest at 700 BPD and at 2333 RPM is calculated to be 24.39 ((700*23)/(932.232*0.708)). The result can be verified from a curve 460 representing performance characteristics of the pump example in the fluid of interest at 2333 RPM.

Figure 5:
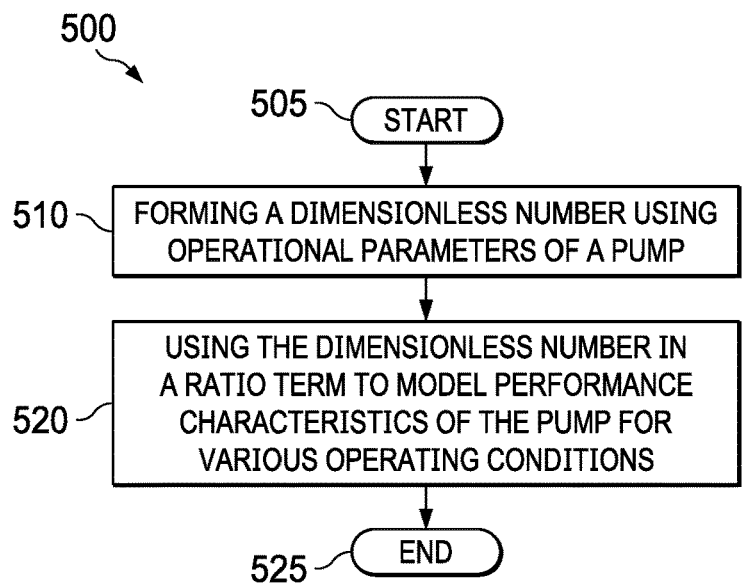
FIG. 5 is a flow diagram of an embodiment of a method for modelling performance characteristics of a pump in a viscous application.

FIG. 5 illustrates a flow diagram of an embodiment of a method 500 for modelling performance characteristics of a pump in a viscous application. The method 500 may be performed by a computer system, such as 600 in FIG. 6. A series of instructions that causes, when executed, a processor of a computer system to perform the method 500 may be stored in a computer readable medium, such as a CD-ROM, a floppy disk, a flash drive, or another data storage. The method 500 starts at step 505.

At step 510, operational parameters of the pump are used to from a dimensionless number. The operating parameters of the pump include a head, a flow rate, a speed, a viscosity, a stage diameter, a BHP, and efficiency, and they are arranged in a dimensionless form, such as the dimensionless relationship mentioned above, which is between a flow rate, a head and a viscosity for Ketan's viscous head number.

At step 520, the dimensionless number is used in a ratio term to model the performance characteristics of the pump for various operating conditions. The ratio term includes a ratio of each operational parameter to a corresponding operational parameter at a reference point. The reference point can be any point in a performance curve such as a BEP point, a point near zero flow rate and/or near the maximum flow rate. The method 500 ends at step 525.

Figure 6:
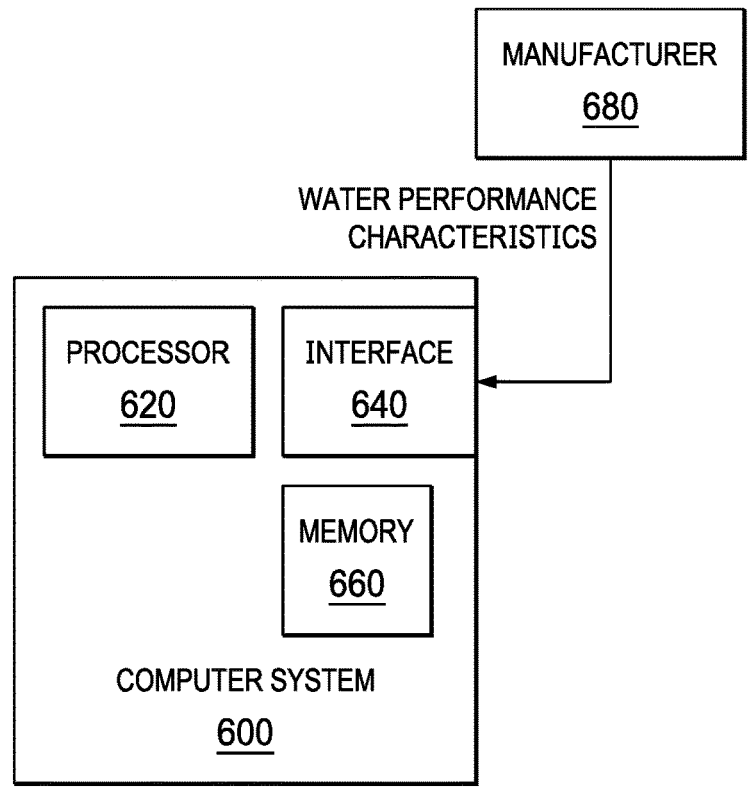
FIG. 6 is a block diagram of an embodiment of a computer system implemented according to the principles of the disclosure.

FIG. 6 illustrates an embodiment of a computer system that has been constructed and configured to perform a viscous performance prediction method, such as 300 in FIG. 3 or 500 in FIG. 5. In the illustrated embodiment, the system 600 includes a processor 620, an interface 640 and a memory 660. It is understood that the system 400 has been simplified for the illustration purposes and may not illustrate some of the components that may be present in an actual system.

The processor 620 is a processing unit such as a central processing unit and/or a graphics processing unit that is configured to predict a performance of a given pump in a fluid of interest at a desired RPM. The processor is coupled to the interface 640 and the memory 660.

The interface 640 is a user interface and/or a network interface card that is configured to receive water performance characteristics of the given pump. As discussed above, the water performance characteristics of the given pump are generally provided from a manufacturer 680 of the given pump. The interface 640 can be a communications interface that is configured to communicate data, i.e., transmit and receive data. As such, the interface 640 can include the necessary logic, ports, terminals, connectors, etc., to communicate data. The ports, terminals, connectors, may be conventional receptacles for communicating data via a communications network.

The memory 660 is a computer memory such as a Read-only memory (ROM), a programmable ROM (PROM), an erasable PROM, a dynamic random-access memory (DRAM), a static random-access memory, and a flash memory. The memory 660 is configured to store the received water performance characteristics of the given pump and other calculated performance characteristics from the processor 620. The memory 660 can also be configured to store computer executable instructions to direct the operation of the processor 620 when initiated thereby. The operating instructions may correspond to an algorithm or algorithms that predict a performance of a given pump in a fluid of interest at a desired RPM.

Figure 7:
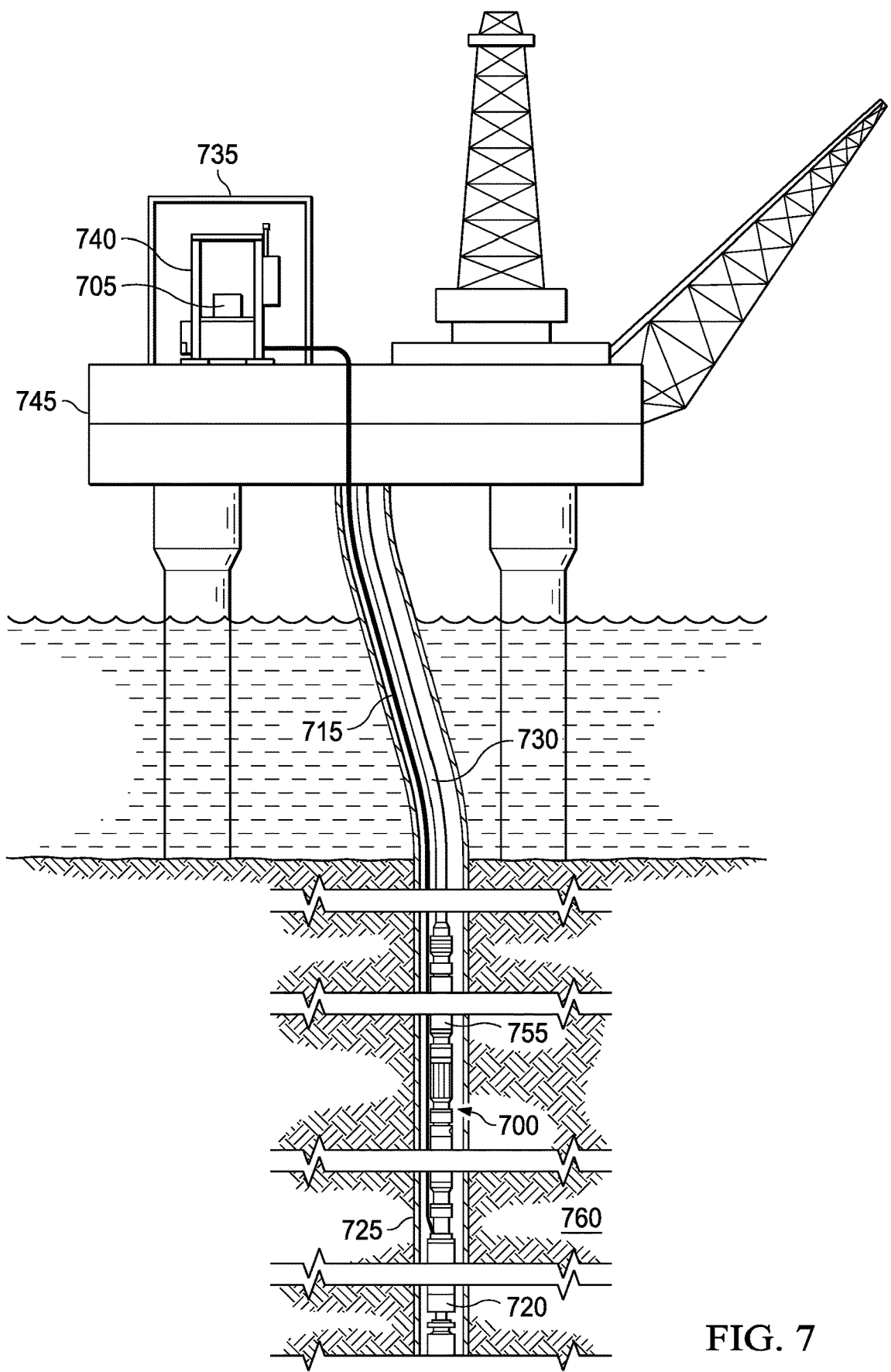
FIG. 7 is an exemplary viscous application of an electric submersible pump (ESP).

FIG. 7 illustrates a viscous application of an electric submersible pump (ESP). In the illustrated application, an ESP assembly 700 is placed downhole in an oil well underground below the ocean. The ESP assembly 700 can also be used for onshore operations. The ESP assembly 700 includes a speed controller 705, an ESP motor 720, e.g., a DC motor, and an ESP pump 755.

In the illustrated embodiment, the speed controller 705 is placed in a cabinet 740 inside a control room 735 on an offshore platform 745, such as an oil rig. The speed controller 705 is configured to adjust the speed of the ESP motor 720 to increase well productivity. In the illustrated embodiment, the ESP motor 720 is a two-pole, three-phase squirrel cage induction motor that operates to turn the ESP pump 755. The ESP motor 720 is located near the bottom of the ESP assembly 700, just above downhole sensors deep within a well. A power cable 715 extends from the speed controller 705 to the ESP motor 720. The power cable 715 may be up to 12,000 feet in length.

The ESP pump 755 may be a multi-stage centrifugal pump including an impeller and a diffuser at each stage. Before the deployment, the performance of the ESP pump 755 is predicted using a viscous performance prediction method, such as 300 in FIG. 3, by a computer system, such as 500 in FIG. 5. Based on the prediction, the ESP pump 755 may be controlled to move fluid of interest such as oil or other hydrocarbons through production tubing 730 to storage tanks onboard the offshore platform 745.

In some embodiments, the pump 755 may be a horizontal surface pump, a progressive cavity pump or an electric submersible progressive cavity pump. A motor seal section and intake section may extend between the motor 720 and the pump 755. A well casing 725 may separate the ESP assembly 700 from well formation 760 and/or seawater. Perforations in the casings 725 may allow the fluid of interest from the formation 760 to enter the casing 725 underground.

A portion of the above-described apparatus, systems or methods may be embodied in or performed by various analog or digital data processors, wherein the processors are programmed or store executable programs of sequences of software instructions to perform one or more of the steps of the methods. A processor may be, for example, a programmable logic device such as a programmable array logic (PAL), a generic array logic (GAL), a field programmable gate arrays (FPGA), or another type of computer processing device (CPD). The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed examples or embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floppy disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

Aspects disclosed herein includes:

A. A method for predicting a performance of a pump in fluid of interest at a desired RPM, comprising: receiving water performance characteristics of the pump at a fixed RPM; determining Ketan's viscous head numbers for flow rates of the pump in water at a desired RPM using the water performance characteristics of the pump at the fixed RPM, the Ketan's viscous head numbers representing ratios of the flow rates to corresponding heads at a fixed internal resistance and at the desired RPM; determining a viscous head correlation between normalized flow rates of the pump in water at the desired RPM and normalized Ketan's viscous head numbers corresponding to the normalized flow rates using water performance characteristics of the pump at the desired RPM; and predicting the performance of the pump in the fluid of interest at the desired RPM using the viscous head correlation.

B. A system for predicting a performance of a pump in fluid of interest at a desired RPM, comprising: an interface configured to receive water performance characteristics of the pump at a fixed RPM; and a processor coupled to the interface and configured to: determine Ketan's viscous head numbers for flow rates of the pump in water at a desired RPM using water performance characteristics of the pump at a fixed RPM, the Ketan's viscous head numbers representing ratios of the flow rates to corresponding heads at a fixed internal resistance and at the desired RPM; determine a viscous head correlation between normalized flow rates of the pump in water at the desired RPM and normalized Ketan's viscous head numbers corresponding to the normalized flow rates using water performance characteristics of the pump at the desired RPM; and predict the performance of the pump in the fluid of interest at the given RPM using the viscous head correlation.

C. A method of modelling performance characteristics of a pump in a viscous application, comprising: forming a dimensionless number using operational parameters of the pump; and using the dimensionless number in a ratio term to model the performance characteristics of the pump for various operating conditions.

Each of aspects A, B and C can have one or more of the following additional elements in combination. Element 1: further comprising calculating the water performance characteristics of the pump at the desired RPM using affinity laws and the water performance characteristics of the pump at the fixed RPM, and the water performance characteristics of the pump at the fixed RPM includes best efficiency point (BEP) water performance characteristics of the pump at the fixed RPM. Element 2: wherein the water performance characteristics of the pump at the desired RPM are calculated by using: a flow rate at the desired RPM=Flow at the fixed RPM*(the desired RPM/the fixed RPM); a head at the desired RPM=a head at the fixed RPM*(the desired RPM/the fixed RPM)^2; and a BHP at the desired RPM=a BHP at the fixed RPM*(the desired RPM/the fixed RPM)^3. Element 3: further comprising calculating a BEP flow rate of the pump in the fluid of interest at the desired RPM based on a flow rate correction factor derived from a relationship of a BEP flow rate ratio with changing RPM and viscosity and calculating a BEP head of the pump in the fluid of interest at the desired RPM based on a head correction factor derived from a relationship of a BEP head ratio and with the changing RPM and viscosity. Element 4: wherein the flow rate correction factor for the BEP flow rate of the pump in the fluid of interest at the desired RPM is derived further from the desired RPM and a viscosity of the fluid of interest. Element 5: wherein the head correction factor for the BEP head of the pump in the fluid of interest at the desired RPM is derived further from the desired RPM and a viscosity of the fluid of interest. Element 6: further comprising defining a desired flow rate, the desired RPM, the fluid of interest, and a desired stage of the pump based on a viscous application at which the pump will be used. Element 7: further comprising calculating a specific speed of the pump at a desired stage using BEP water performance characteristics of the pump at the fixed RPM. Element 8: wherein the BEP water performance characteristics of the pump at the fixed RPM are provided from a water performance curve of the pump. Element 9: wherein the determining the viscous head correlation includes determining the normalized flow rates of the pump in water at the desired RPM by normalizing the flow rates of the pump in the water at the desired RPM using a reference flow rate of the pump in the water at the desired RPM. Element 10: wherein the determining the viscous head correlation further includes determining the normalized Ketan's viscous head numbers by normalizing the Ketan's viscous head numbers using a Ketan's viscous head number corresponding to the reference flow rate of the pump in the water at the desired RPM. Element 11: wherein the reference flow rate of the pump is selected from the group consisting of a BEP flow rate, a near zero flow rate, and a near maximum flow rate of the pump in the water at the desired RPM. Element 12, wherein the predicting the performance of the pump includes calculating a head of the pump in the fluid of interest at the desired flow rate and at the desired RPM using the viscous head correlation, a BEP flow rate of the pump in the fluid of interest at the desired RPM, a BEP head of the pump in the fluid of interest at the desired RPM, and a normalized BEP flow rate of the pump in the fluid of interest at the desired RPM. Element 13: the calculating the head of pump in the fluid of interest at the desired flow rate and at the desired RPM includes: calculating the normalized BEP flow rate of the pump in the fluid of interest at the desired RPM based on the desired flow rate and the BEP flow rate of the pump in the fluid of interest at the desired RPM; calculating a normalized Ketan's viscous head number corresponding to the normalized BEP flow rate of the pump in the fluid of interest at the desired RPM using the viscous head correlation; and calculating the head of the pump in the fluid of interest at the desired flow rate and at the desired RPM based on the desired flow rate, the BEP flow rate of the pump in the fluid of interest at the desired RPM, the BEP head of the pump in the fluid of interest at the desired RPM, and the normalized Ketan's viscous head number corresponding to the normalized BEP flow rate of the pump in the fluid of interest at the desired RPM. Element 14: further comprising changing a size of the pump based on the performance of the pump in the fluid of interest at the desired RPM. Element 15: wherein the operational parameters of the pump includes at least one of a head, a flow rate, a speed, a viscosity, a diameter, a brake horse power, and an efficiency. Element 16: wherein the ratio term includes a ratio of each of the operating parameters to a corresponding operating parameter at a reference point. Element 17: wherein the reference point is a point in a performance curve and selected from the group consisting of a best efficiency point, a point near zero flow condition, and a point near the maximum flow rate.

What is claimed is:

1. A method for predicting a head performance of a pump in fluid of interest at a desired revolution per minute (RPM), comprising:

determining Ketan's viscous head numbers for flow rates of the pump in water at a desired RPM using water performance characteristics of the pump at a fixed RPM, the Ketan's viscous head numbers representing ratios of the flow rates to corresponding heads at a fixed viscosity and at the desired RPM;

determining a viscous head correlation between normalized flow rates of the pump in water at the desired RPM and normalized Ketan's viscous head numbers corresponding to the normalized flow rates using water performance characteristics of the pump at the desired RPM;

predicting the head performance of the pump in the fluid of interest at the desired RPM using the viscous head correlation; and modifying a size of the pump based on the predicted head performance.

2. The method of claim 1 further comprising calculating the water performance characteristics of the pump at the desired RPM using affinity laws and the water performance characteristics of the pump at the fixed RPM, and the water performance characteristics of the pump at the fixed RPM includes best efficiency point (BEP) water performance characteristics of the pump at the fixed RPM.

3. The method of claim 2, wherein the water performance characteristics of the pump at the desired RPM are calculated by using:

$$\text{a flow rate at the desired RPM} = \text{Flow at the fixed RPM} * (\text{the desired RPM}/\text{the fixed RPM});$$

$$\text{a head at the desired RPM} = \text{a head at the fixed RPM} * (\text{the desired RPM}/\text{the fixed RPM})^2; \text{ and}$$

$$\text{a BHP at the desired RPM} = \text{a BHP at the fixed RPM} * (\text{the desired RPM}/\text{the fixed RPM})^3.$$

4. The method of claim 1 further comprising calculating a BEP flow rate of the pump in the fluid of interest at the desired RPM based on a flow rate correction factor derived from a relationship of a BEP flow rate ratio with changing RPM and viscosity and calculating a BEP head of the pump in the fluid of interest at the desired RPM based on a head correction factor derived from a relationship of a BEP head ratio and with the changing RPM and viscosity.

5. The method of claim 4, wherein the flow rate correction factor for the BEP flow rate of the pump in the fluid of interest at the desired RPM is derived further from the desired RPM and a viscosity of the fluid of interest.

6. The method of claim 4, wherein the head correction factor for the BEP head of the pump in the fluid of interest at the desired RPM is derived further from the desired RPM and a viscosity of the fluid of interest.

7. The method of claim 1, further comprising defining a desired flow rate, the desired RPM, the fluid of interest, and a desired stage of the pump based on a viscous application at which the pump will be used.

8. The method of claim 1, wherein the determining the viscous head correlation includes determining the normalized flow rates of the pump in water at the desired RPM by normalizing the flow rates of the pump in the water at the desired RPM using a reference flow rate of the pump in the water at the desired RPM.

9. The method of claim 8, wherein the determining the viscous head correlation further includes determining the normalized Ketan's viscous head numbers by normalizing the Ketan's viscous head numbers using a Ketan's viscous head number corresponding to the reference flow rate of the pump in the water at the desired RPM.

10. The method of claim 1, wherein the predicting the head performance of the pump includes calculating a head of the pump in the fluid of interest at a desired flow rate and at the desired RPM using the viscous head correlation, a BEP flow rate of the pump in the fluid of interest at the desired RPM, a BEP head of the pump in the fluid of interest at the desired RPM, and a normalized BEP flow rate of the pump in the fluid of interest at the desired RPM.

11. The method of claim 10, wherein the calculating the head of pump in the fluid of interest at the desired flow rate and at the desired RPM includes:

calculating the normalized BEP flow rate of the pump in the fluid of interest at the desired RPM based on the desired flow rate and the BEP flow rate of the pump in the fluid of interest at the desired RPM;

calculating a normalized Ketan's viscous head number corresponding to the normalized BEP flow rate of the pump in the fluid of interest at the desired RPM using the viscous head correlation; and calculating the head of the pump in the fluid of interest at the desired flow rate and at the desired RPM based on the desired flow rate, the BEP flow rate of the pump in the fluid of interest at the desired RPM, the BEP head of the pump in the fluid of interest at the desired RPM, and the normalized Ketan's viscous head number corresponding to the normalized BEP flow rate of the pump in the fluid of interest at the desired RPM.

12. A system for predicting a head performance of a pump in fluid of interest at a desired revolution per minute (RPM), comprising:

an interface configured to receive water performance characteristics of the pump at a fixed RPM; and a processor coupled to the interface and configured to:

determine Ketan's viscous head numbers for flow rates of the pump in water at a desired RPM using the water performance characteristics of the pump at the fixed RPM, wherein the Ketan's viscous head numbers represent ratios of the flow rates to corresponding heads at a fixed viscosity and at the desired RPM;

determine a viscous head correlation between normalized flow rates of the pump in water at the desired RPM and normalized Ketan's viscous head numbers corresponding to the normalized flow rates using water performance characteristics of the pump at the desired RPM; and predict the head performance of the pump in the fluid of interest at the desired RPM using the viscous head correlation, wherein a size of the pump is modified based on the predicted head performance.

13. The system of claim 12, wherein the processor is further configured to calculate the water performance characteristics of the pump at the desired RPM using affinity laws and the water performance characteristics of the pump at the fixed RPM, and the water performance characteristics of the pump at the fixed RPM includes best efficiency point (BEP) water performance characteristics of the pump at the fixed RPM.

14. The system of claim 12, wherein the processor is further configured to:

calculate a BEP flow rate of the pump in the fluid of interest at the desired RPM based on a flow rate correction factor derived from a relationship of a BEP flow rate ratio with changing RPM and viscosity; and calculate a BEP head of the pump in the fluid of interest at the desired RPM based on a head correction factor derived from a relationship of a BEP head ratio with the changing RPM and viscosity.

15. The system of claim 12, wherein the processor is further configured to calculate a specific speed of the pump at a desired stage using BEP water performance characteristics of the pump at the fixed RPM.

16. The system of claim 12, wherein the processor is further configured to determine the normalized flow rates of the pump in water at the desired RPM by normalizing the flow rates of the pump in the water at the desired RPM using a reference flow rate of the pump in the water at the desired RPM.

17. The system of claim 16, wherein the processor is further configured to determine the normalized Ketan's viscous head numbers by normalizing the Ketan's viscous head numbers using a Ketan's viscous head number corresponding to the reference flow rate of the pump in the water at the desired RPM.

18. The system of claim 17, wherein the reference flow rate of the pump is selected from the group consisting of a BEP flow rate, a near zero flow rate, and a near maximum flow rate of the pump in the water at the desired RPM.

19. The system of claim 12, wherein the head performance of the pump is predicted by calculating a head of the pump in the fluid of interest at a desired flow rate and at the desired RPM using the viscous head correlation, a BEP flow rate of the pump in the fluid of interest at the desired RPM, a BEP head of the pump in the fluid of interest at the desired RPM, and a normalized BEP flow rate of the pump in the fluid of interest at the desired RPM.

20. The system of claim 19, wherein the calculating the head of pump in the fluid of interest at the desired flow rate and at the desired RPM includes:
  calculating the normalized BEP flow rate of the pump in the fluid of interest at the desired RPM based on the BEP flow rate of the pump in the fluid of interest at the desired RPM;
  calculating a normalized Ketan's viscous head number corresponding to the normalized BEP flow rate of the pump in the fluid of interest at the desired RPM using the viscous head correlation; and
  calculating the head of the pump in the fluid of interest at the desired flow rate and at the desired RPM based on the normalized BEP flow rate of the pump in the fluid of interest at the desired RPM, the BEP head of the pump in the fluid of interest at the desired RPM, and the normalized Ketan's viscous head number corresponding to the normalized BEP flow rate of the pump in the fluid of interest at the desired RPM.

* * * * *